(12) United States Patent
Kitazaki et al.

(10) Patent No.: US 6,339,023 B1
(45) Date of Patent: Jan. 15, 2002

(54) METHOD OF REDUCING STRESS IN BLANKET TUNGSTEN FILM FORMED BY CHEMICAL VAPOR DEPOSITION PROCESS

(75) Inventors: Masaki Kitazaki; Keiichi Tanaka, both of Narita (JP)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/647,707
(22) PCT Filed: Apr. 6, 1999
(86) PCT No.: PCT/JP99/01822
   § 371 Date: Oct. 4, 2000
   § 102(e) Date: Oct. 4, 2000
(87) PCT Pub. No.: WO99/53537
   PCT Pub. Date: Oct. 21, 1999

(30) Foreign Application Priority Data

Apr. 10, 1998 (JP) .......................................... 10-099478

(51) Int. Cl.$^7$ ............................................... H01L 21/44
(52) U.S. Cl. ...................................... 438/685; 438/680
(58) Field of Search ................................ 438/648, 685, 438/630, 656

(56) References Cited

U.S. PATENT DOCUMENTS 5,599,739 A * 2/1997 Merchant et al. ........... 438/628
5,795,824 A * 8/1998 Hancock ..................... 438/656

FOREIGN PATENT DOCUMENTS

| JP | 3-280545 | 12/1991 |
| JP | 5-029259 | 2/1993 |
| JP | 5-102082 | 4/1993 |
| JP | 6-208967 | 7/1994 |
| JP | 8-232080 | 9/1996 |

* cited by examiner

Primary Examiner—Kevin M. Picardat
(74) Attorney, Agent, or Firm—McDermott, Will & Emery

(57) ABSTRACT

A method of forming a blanket tungsten film by CVD process. Before forming a nucleus for a blanket W film, a mixture gas of $WF_6$ gas, $SiH_4$,gas and $H_2$ gas is supplied into a vacuum chamber 12. Here, preprocessing is carried out for about several seconds while the respective flows of gases are regulated such that $SiH_4$ gas is in excess with respect to $WF_6$ gas. Preferably, the $WF_6$ gas/$SiH_4$ gas flow ratio is held within the range of 0.15 to 0.35, whereas the processing time is set to 2 to 10 seconds. After this preprocessing, nucleation is carried out, so as to form a blanket W film, whereby the film stress will not increase even if the W film is formed in a lower-temperature environment.

8 Claims, 3 Drawing Sheets

METHOD OF REDUCING STRESS IN BLANKET TUNGSTEN FILM FORMED BY CHEMICAL VAPOR DEPOSITION PROCESS

TECHNICAL FIELD

The present invention relates to a method of reducing the stress of a thin film such as a tungsten thin film formed in a semiconductor manufacturing process and, more particularly, is concerned with a method of reducing the stress of a blanket tungsten thin film formed by chemical vapor deposition (CVD) process.

BACKGROUND ART

In recent years, a tungsten film forming technique based on CVD process has widely been employed in manufacturing of semiconductors, since it is excellent in step coverage, rich in resistance to migration, and easy to etch. For example, the tungsten film (hereinafter referred to as "W film") formed by CVD process has been used for establishing interlayer connection of multilayer wiring by embedding a contact hole or through hole with tungsten.

Conventionally, a method of forming blanket W by CVD comprises the steps of forming a nucleus from tungsten hexafluoride ($WF_6$), monosilane ($SiH_4$), and hydrogen ($H_2$); and subsequently growing blanket W by use of $WF_6$ and $H_2$. As a condition for nucleation, the flow ratio of $WF_6/SiH_4$ is required to be at least 1 in order to prevent vapor phase reactions from occurring.

In general, a film located immediately under the W film is an insulating film. It has been becoming more often that the insulating film is formed by use of organic materials or inorganic materials which are easily degassed. Therefore, while the forming of blanket W by CVD has conventionally been carried out at about 450° C., processing at a lower temperature of about 400° C. is in demand since degassing occurs from the substrate itself or insulating film, and so forth. However, there is a problem that the tensile film stress becomes higher when the film is formed at a lower temperature of about 400° C.

If the thin film formed in a semiconductor manufacturing process has a stress higher than a reference value, which fluctuates between the steps before and after the target step, then microcracks may occur in transistor sections, wiring sections, and the like due to warpage of the silicon wafer, thereby creating inconveniences in focusing at an exposure step subsequent thereto.

DISCLOSURE OF THE INVENTION

In view of the foregoing circumstances, it is an object of the present invention to provide a method of controlling the stress of a blanket W film, by which a film characteristic on a par with the film forming at a higher temperature is obtained without enhancing the film stress even when the film forming processing is carried out at a lower temperature.

The inventors have carried out various studies in order to achieve this object and, as a result, have inferred that, if processing for forming a film is effected at a lower temperature, then a volume contraction occurs due to the merging of gain boundaries, which raises the stress of the film.

Accordingly, the present invention provides a method of forming a blanket W film on a substrate by CVD process, the method including the steps of: evacuating a vacuum chamber containing a substrate to a predetermined degree of vacuum; carrying out preprocessing of the substrate by introducing a first mixed gas containing $WF_6$ gas and $SiH_4$ gas at a predetermined ratio with a $WF_6$ gas/$SiH_4$ gas flow ratio adjusted to 1 or less into the vacuum chamber for a predetermined period of time; forming a nucleus of a blanket W film on the substrate by introducing a second mixed gas containing $WF_6$ gas and $SiH_4$ gas at a predetermined ratio into the vacuum chamber; and then growing a blanket W film on the substrate formed with the nucleus by introducing a third mixed gas containing $WF_6$ gas and $H_2$ gas at a predetermined ratio.

In accordance with the present invention, before the nucleation of the blanket W film, the preprocessing is carried out for a predetermined period of time with the first mixed gas containing $WF_6$ gas and $SiH_4$ gas. It is assumed that, due to the preprocessing, the nucleus of tungsten to be formed later becomes greater, so as to reduce the area of crystal boundaries, thereby lowering the stress of the grown blanket W film. Therefore, even when the processing for forming the blanket W film is carried out at a lower temperature, the film stress would not increase, whereby a film stress on a par with that in the processing at a higher temperature can be maintained.

For obtaining such a stress reducing effect, the $WF_6$ gas/$SiH_4$ gas flow ratio in the first mixed gas is preferably within the range of 0.15 to 0.35, more preferably within the range of 0.2 to 0.3.

The preprocessing using the first mixed gas is carried out preferably for 2 to 10 seconds, more preferably for 3 to 8 seconds.

The first mixed gas may further contain $H_2$ gas, whereas the second mixed gas may contain $H_2$ gas as well.

The term "substrate" is applied in this specification not only to substrates themselves but also to those in which other films such as insulating films are formed on substrates.

These and other features and advantages of the present invention will become apparent to those skilled in the art upon a reading the following detailed description when taken in conjunction with the attached drawings.

BEST MODE FOR CARRYING OUT THE INVENTION

Figure 1:
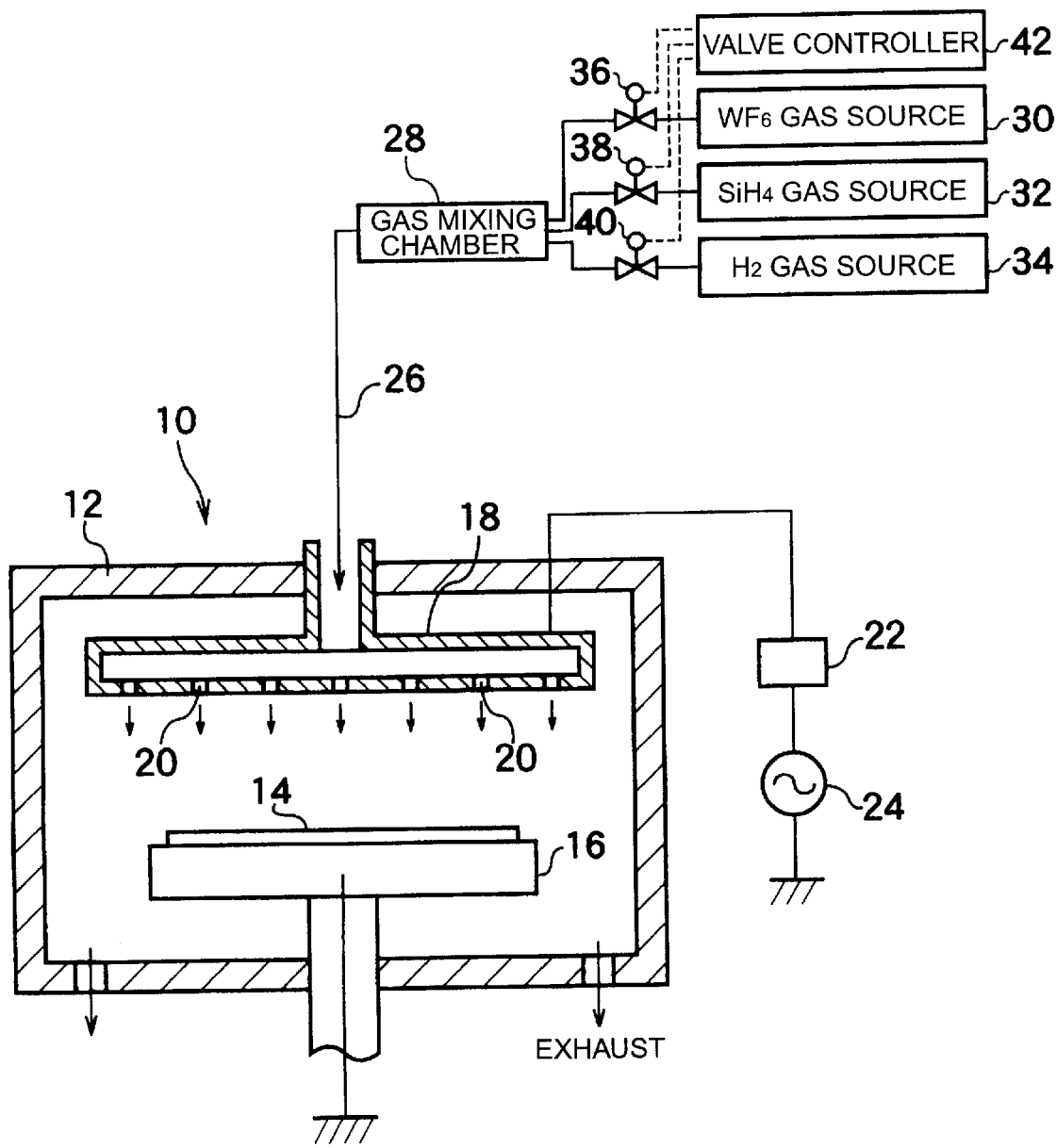
FIG. 1 is a sectional view schematically showing a CVD apparatus which can carry out the method of reducing the stress of a blanket W film in accordance with the present invention.

In the following, preferred embodiments of the present invention will be explained in detail with reference to the drawings. FIG. 1 schematically shows a CVD apparatus which can form a blanket tungsten film on a substrate, i.e., a silicon wafer, according to the method of reducing the stress of a blanket tungsten film in accordance with the present invention. The shown CVD apparatus 10 comprises a vacuum chamber 12 and a substrate support or pedestal 16 for supporting a silicon wafer 14 thereon within the vacuum chamber 12. Above the pedestal 16, a gas distributing plate 18 is disposed so as to face the upper surface of the pedestal 16 in parallel therewith.

The gas distributing plate 18 is a hollow plate, whose lower surface is formed with a number of gas outlets 20. Predetermined processing gases are supplied into the gas distributing plate 18 by way of a pipe 26 from a gas mixing chamber 28 disposed outside the vacuum chamber. The gas mixing chamber 28 is an apparatus for uniformly mixing the processing gases. Connected to. the gas mixing chamber 28 are a $WF_6$ gas source 30, an $SiH_4$ gas source 32 and an $H_2$ gas source 34 by way of their respective gas flow regulating valves 36, 38 and 40.

The gas flow regulating valves 36, 38 and 40 are controlled by a valve control means 42 which is constituted by a microcomputer or the like, and are capable of regulating the respective flows of their corresponding gases, whereby the mixing ratio of processing gases can be set to a predetermined value. The gas distributing plate 18 is made of a metal such as aluminum, and is grounded by way of a matching device 22 and high-frequency power source 24 for applying a high-frequency power of 13.56 MHz, for example. Also, the pedestal 16 is formed from a metal such as aluminum and is grounded similarly.

The procedure of a method of forming a blanket W film on the silicon wafer 14 by use of such a CVD apparatus 10 will now be explained. First, an insulating film such as a BPSG (Boron-doped Phosphor-Silicate Glass) film or the like is formed on a surface of the substrate or silicon wafer 14 in a step before the wafer is loaded into the CVD apparatus. Also, as a barrier metal layer, a Ti film and a TiN film are successively formed on the upper surface of the insulating film by sputtering or the like. The forming of these layers is a known technique, and is carried out in a processing chamber apparatus which is separated from the above-mentioned CVD apparatus 10. Such a silicon wafer 14 having a Ti/TiN film on the topmost layer is disposed at a predetermined appropriate position on the pedestal 16 in the vacuum chamber 12 by means of an appropriate loading robot by way of a vacuum transport chamber (not shown).

In the method of reducing the stress of a blanket W film in accordance with the present invention, before the nucleation, i.e., before forming a W nucleation film, preprocessing is carried out for a predetermined period of time by using a first mixed gas containing $WF_6$ gas and $SiH_4$ gas at a predetermined ratio while making the ratio of $SiH_4$ gas in excess with respect to $WF_6$ gas. After this preprocessing, nucleation is carried out with a second mixed gas containing $WF_6$ gas and $SiH_4$ gas at a predetermined ratio. Then, the blanket W film is grown by use of a third mixed gas containing $WF_6$ gas and $H_2$ gas at a predetermined ratio.

For preventing particles from occurring due to a vapor phase reaction without causing reactions on the substrate, the first mixed gas may contain other gases such as $H_2$ gas. The second mixed gas may also contain other gases such as $H_2$ gas. In the following, a case where the first and second mixed gases contain $H_2$ gas will be explained. Also, though not described in particular, argon gas is used as a carrier gas for the first, second, and third mixed gases.

First, the vacuum chamber 12 is evacuated to a predetermined degree of vacuum, and then $WF_6$ gas, $SiH_4$ gas, and $H_2$ gas are supplied to the gas mixing chamber 28 from the $WF_6$ gas source 30, $SiH_4$ gas source 32, and $H_2$ gas source 34, respectively. These gases are mixed in the gas mixing chamber 28, and are introduced into the vacuum chamber 12 from the gas distributing plate 18 as the first processing gas or mixed gas. More specifically, the first mixed gas supplied to the gas distributing plate 18 is jetted out of a number of gas outlets 20, so as to be sent into a space between the gas distribution plate 18 and pedestal 16. Also, after or simultaneously with the gas introduction, the high-frequency power source 24 is turned ON, so as to generate plasma between the pedestal 16 and gas distributing plate 18. Here, the preprocessing is carried out for a short period of about several seconds while the gas flow regulating valves 36, 38, 40 regulate their corresponding gas flows such that $SiH_4$ gas is in excess with respect to $WF_6$ gas, i.e., the flow ratio of $WF_6$ gas/$SiH_4$ gas is 1 or less.

Preferably, the flow ratio of $WF_6$ gas/$SiH_4$ gas is set to 0.15 to 0.35. If the gas flow ratio is out side this range, then the stress of formed W film may enhance. More preferably, the gas flow ratio falls within the range of 0.2 to 0.3.

The preprocessing time is preferably 2 to 10 seconds, more preferably 3 to 8 seconds. The effect of reducing the stress of W film may not fully be obtained if the preprocessing time is 2 seconds or less, whereas there will be a higher possibility of particles occurring due to a vapor phase reaction of $SiH_4$ gas if the preprocessing time exceeds 10 seconds, which is undesirable. It is assumed that such preprocessing enhances the nucleus of tungsten which will be formed later, so as to reduce the area of crystal boundaries, thereby lowering the stress of grown W film.

Next, $WF_6$ gas, $SiH_4$ gas and $H_2$ gas are fed from their corresponding sources and are mixed within the gas mixing chamber 28, so as to be supplied into the vacuum chamber 12 as a second mixed gas. The high-frequency power source 24 is turned ON in this process as well, whereby a nucleus for a W film is formed from the second mixed gas by plasma CVD process. In this nucleation process, in order to prevent the vapor phase reaction of $SiH_4$ from occurring, the $WF_6$ gas/$SiH_4$ gas flow ratio is required to be at least 1, preferably about 2.

Subsequently, tungsten is grown by use of the third mixed gas containing $WF_6$ gas and $H_2$ gas at a predetermined ratio, so as to form a blanket W film on the TiN film of the silicon wafer by a thermochemical reaction. This process is also carried out in a state where plasma is generated.

The gas mixing ratios in the second mixed gas and third mixed gas are regulated as the valve control means 42 controls the gas flow regulating valves 36, 38 and 40 as in the case of the first mixed gas.

Thus formed blanket W film does not enhance its film stress even when the film forming processing is carried out at a lower temperature of about 400° C., and can maintain a film stress on a par with that in higher-temperature processing of 450° C. or over. Therefore, the silicon wafer can be kept from warping and thereby generating microcracks in transistor sections, wiring sections, and the like or creating inconveniences in focusing or the like at an exposure step subsequent thereto, whereby semiconductor devices can be made with a higher yield.

EXAMPLE

In the following, the present invention will be explained in further detail with reference to an example. In this example, a single-wafer-processing multi-chamber CVD apparatus manufactured and sold under the name of "Centura (registered trademark)" by Applied Materials Incorporated, California, USA was used as the CVD apparatus 10 shown in FIG. 1. In this CVD apparatus, while a silicon wafer formed with a TiN film was mounted on the pedestal, the vacuum chamber was evacuated to a predetermined degree of vacuum. The temperature of pedestal was set to 390° C. Then, a mixed gas of WF$_6$ gas, SiH$_4$ gas, and H$_2$ gas was introduced into the vacuum chamber, so as to carry out preprocessing. Here, the respective flows of gases from their sources were regulated by their corresponding gas flow regulating valves, so as to adjust the WF$_6$ gas/SiH$_4$ gas flow ratio within the range of 0.1 to 0.5, thereby yielding a plurality of samples. Also, the processing time was changed within the range of 0 to 8 seconds, so as to yield a plurality of samples.

Next, for each silicon wafer subjected to the foregoing preprocessing, the second mixed gas containing WF$_6$ gas, SiH$_4$ gas, and H$_2$ gas at a predetermined ratio was introduced into the vacuum chamber, so as to carry out nucleation of a W film. Here, the WF$_6$ gas/SiH$_4$ gas flow ratio was set to 1 or higher.

Subsequently, tungsten was grown by use of the third mixed gas containing WF$_6$ gas and H$_2$ gas at a predetermined ratio, whereby a blanket W film was formed on the TiN film of the silicon wafer upon a thermochemical reaction.

Figure 2:
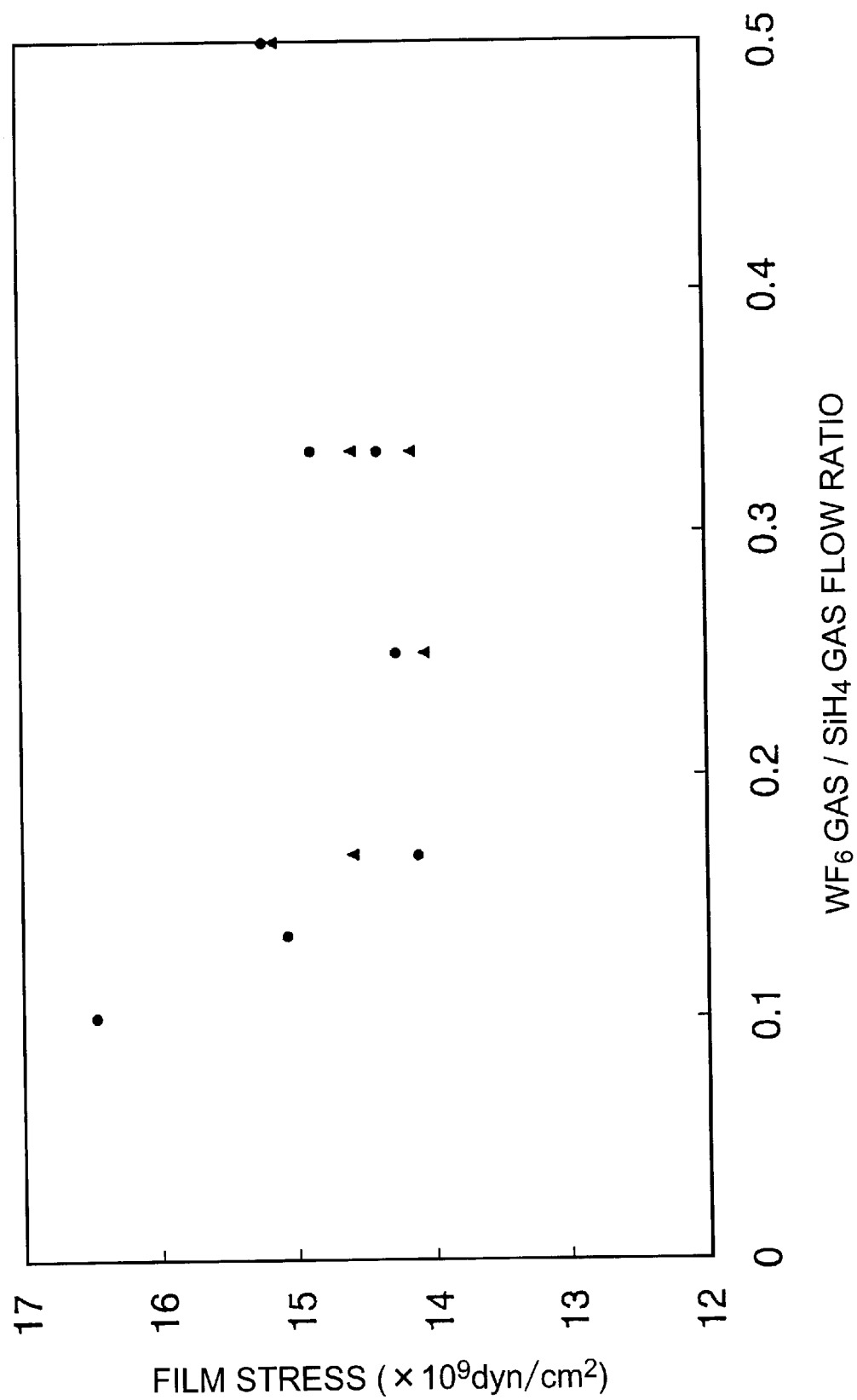
FIG. 2 is a graph showing the relationship between the $WF_6$ gas /$SiH_4$ gas flow ratio in the preprocessing in an example of the present invention and the film stress of the blanket W film.
Figure 3:
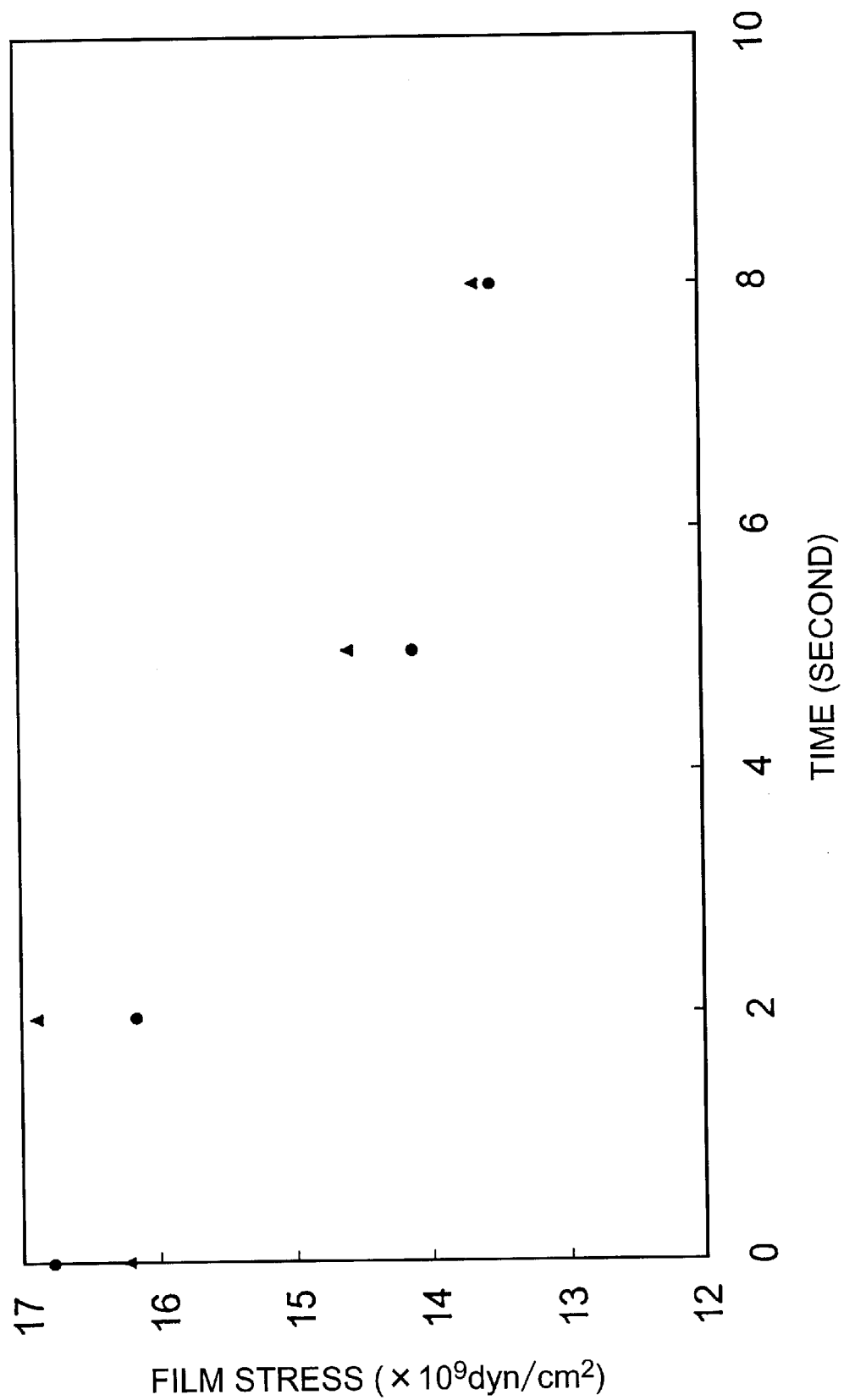
FIG. 3 is a graph showing the relationship between the preprocessing time in the preprocessing in the example of the present invention and the film stress of the blanket W film.

FIG. 2 is a graph showing the relationship between the WF$_6$ gas/SiH$_4$ gas flow ratio in the preprocessing and the stress of blanket w film. On the other hand, FIG. 3 is a graph showing the relationship between the preprocessing time and the stress of blanket W film. In this example, two kinds of silicon wafers were used. These silicon wafers differ from each other only in the TiN film forming condition. In each of FIGS. 2 and 3, the first and second kinds of silicon wafers correspond to symbols of circle "●" and triangle "▲", respectively.

As is clear from FIG. 2, the tensile stress of blanket W film became 14×10$^9$ to 15×10$^9$ dyn/cm$^2$ when the WF$_6$ gas/SiH$_4$ gas flow ratio was 0.15 to 0.35, more specifically 0.2 to 0.3. Conventional film forming methods correspond to the case where the preprocessing time was 0 second in FIG. 3, and yielded a film stress of 16×10$^9$ to 17×10$^9$ dyn/cm$^2$. Therefore, it can be seen that the film stress was greatly reduced by the present invention. Also, as is clear from FIG. 3, the film stress was lowered to 13.5×10$^9$ to 14.5×10$^9$ dyn/cm$^2$ when the preprocessing time was about 2 to 10 seconds, more specifically 3 to 8 seconds.

INDUSTRIAL APPLICABILITY

According to the present invention, since the preprocessing is carried out for a predetermined period of time with a first mixed gas containing WF$_6$ gas and SiH$_4$ gas regulated so as to yield a flow ratio within a predetermined range before forming a nucleus for a blanket tungsten film, the nucleus of tungsten to be formed later is assumed to become greater, so as to reduce the area of crystal boundaries, whereby the blanket tungsten film grown by CVD process would lower its stress. Therefore, even when the film forming processing is carried out at a lower temperature, the film stress would not increase, so that a film stress on a par with that in higher-temperature processing can be maintained, whereby the silicon wafer can be kept from warping and thereby generating microcracks in transistor sections, wiring sections, and the like or creating inconveniences in focusing or the like at an exposure step subsequent thereto, whereby semiconductor devices can be made with a higher yield.

What is claimed is:

1. A method of forming a blanket tungsten film on a substrate by chemical vapor deposition process, said method including:

a first step of evacuating a vacuum chamber containing a substrate to a predetermined degree of vacuum;

a second step of carrying out preprocessing of said substrate by introducing a first mixed gas containing tungsten hexafluoride gas and monosilane gas with a tungsten hexafluoride gas/monosilane gas flow ratio adjusted to less than 1 into said vacuum chamber for a processing time within the range of 2 to 10 seconds;

a third step of forming a nucleus of a blanket tungsten film on said substrate by introducing a second mixed gas containing tungsten hexafluoride gas and monosilane gas with a tungsten hexafluoride gas/monosilane gas flow ratio adjusted to 1 or more into said vacuum chamber after completion of said second step; and a fourth step of growing a tungsten film on said substrate formed with said nucleus by introducing a third mixed gas containing tungsten hexafluoride gas and hydrogen gas at a predetermined ratio after completion of said third step.

2. A method according to claim 1, wherein said tungsten hexafluoride gas/monosilane gas flow ratio is within the range of 0.15 to 0.35.

3. A method according to claim 1, wherein said tungsten hexafluoride gas/monosilane gas flow ratio is within the range of 0.2 to 0.3.

4. A method according to claim 1, wherein said preprocessing of said substrate at said second step is carried out for a processing time within the range of 3 to 8 seconds.

5. A method according to claim 1, wherein said first mixed gas further contains hydrogen gas.

6. A method according to claim 1, wherein said second mixed gas further contains hydrogen gas.

7. A method according to claim 1, wherein said substrate is a silicon wafer.

8. A method according to claim 7, wherein an insulating film is formed on said silicon wafer, said blanket tungsten film being formed on said insulating film.

* * * * *